US007239528B1

(12) United States Patent
McLeod (10) Patent No.: US 7,239,528 B1
(45) Date of Patent: Jul. 3, 2007

(54) TECHNIQUES FOR ACCOMMODATING VARIATIONS IN CHASSIS TOLERANCES

(75) Inventor: Gary McLeod, Flagstaff, AZ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/243,760

(22) Filed: Oct. 5, 2005

(51) Int. Cl.
*H05K 7/14* (2006.01)
*H05K 7/18* (2006.01)

(52) U.S. Cl. .................. 361/796; 361/788; 361/797; 361/679; 211/41.17

(58) Field of Classification Search ............... 361/796, 361/778, 810, 785, 690, 797, 736, 744, 730, 361/752, 788, 679, 683; 439/65, 75; 211/41.17; 710/301
See application file for complete search history.

(56) References Cited

U.S. PATENT DOCUMENTS

| 4,838,798 | A | * | 6/1989 | Evans et al. ............ 439/61 |
| 5,335,146 | A | * | 8/1994 | Stucke .................. 361/785 |
| 6,335,867 | B1 | * | 1/2002 | Ishibashi et al. ........ 361/788 |
| 6,392,142 | B1 | * | 5/2002 | Uzuka et al. ........... 174/541 |
| 6,418,026 | B1 | * | 7/2002 | Ho et al. ............... 361/727 |
| 6,456,498 | B1 | * | 9/2002 | Larson et al. ........... 361/752 |
| 6,561,850 | B2 | | 5/2003 | Letourneau et al. ..... 439/608 |
| 6,608,762 | B2 | * | 8/2003 | Patriche ................ 361/788 |
| 6,646,868 | B2 | * | 11/2003 | Ho et al. ............... 361/684 |
| 6,690,584 | B2 | * | 2/2004 | Uzuka et al. ........... 361/796 |
| 6,847,521 | B2 | | 1/2005 | Beall et al. ............. 361/682 |
| 6,950,895 | B2 | * | 9/2005 | Bottom ................. 710/301 |
| 6,963,495 | B1 | | 11/2005 | Carullo et al. .......... 361/818 |
| 7,007,809 | B2 | * | 3/2006 | Greenside ............ 211/41.17 |
| 7,145,780 | B2 | * | 12/2006 | Malone et al. .......... 361/752 |
| 2005/0207134 | A1 | * | 9/2005 | Belady et al. .......... 361/796 |

* cited by examiner

*Primary Examiner*—Tuan Dinh
*Assistant Examiner*—Dameon E. Levi
(74) *Attorney, Agent, or Firm*—BainwoodHuang (57) ABSTRACT

Techniques for accommodating chassis tolerances use joiners which enable outer side panels for a front card cage to reference a front side of a midplane, and outer side panels for a rear card cage to reference a rear side of the midplane. The joiners couple the outer side panels together in a rigid but accommodating manner regardless of variations in midplane board thickness. Accordingly, both the front and rear card cages are capable of accurately and consistently referencing from the midplane sides. Not only do these techniques solve registration drawbacks which exist in conventional midplane installation approaches involving the bolting of midplanes to the middles of pre-constructed frames, these techniques further enable accurate direct connection of other components such as a power supply subsystem (e.g., to the midplane front side) and a fan assembly (e.g., to the midplane rear side) thus alleviating the need for burdensome cables.

22 Claims, 9 Drawing Sheets

TECHNIQUES FOR ACCOMMODATING VARIATIONS IN CHASSIS TOLERANCES

BACKGROUND

In general, a midplane is a centrally located circuit board structure which connects to other circuit boards on both sides. That is, the midplane is planar in shape, and defines a front side and a back side. Some circuit boards connect to the front side of the midplane. Other circuit boards connect to the back side of the midplane.

Such a midplane typically includes multiple conductive and non-conductive layers which are sandwiched together in order to provide a dense network of electrical connections between the connecting circuit boards. Accordingly, the circuit boards are capable of enjoying a high degree of electrical connectivity within a relatively small space.

Manufacturers typically pre-construct large frames for carrying such midplanes, and bolt these midplanes in the middles of the large pre-constructed frames. As a result, the midplanes divide the pre-constructed frames into two halves, namely, front card cages and rear card cages. Next, the manufacturers insert circuit boards into the front card cages until the circuit boards connect to front sides of the midplanes, and other circuit boards into the rear card cages until these other circuit boards connect to rear sides of the midplanes. The manufacturers are also capable of electrically connecting other components to the midplanes such as fans or power supplies using cables. In this manner, the manufacturers are capable of forming highly dense networks of electronic circuitry.

SUMMARY

Unfortunately, there are deficiencies to the above-described conventional approach to bolting midplanes in the middles of large pre-constructed frames. For example, the above-described conventional approach is not well-suited for accommodating midplanes that may have wide variations in board thickness. In particular, if a manufacturer were to install a midplane so that a front side of the midplane was properly aligned with a front card cage of a pre-constructed frame, any tolerance deviation in the board thickness of that midplane would be imposed on the rear card cage of the pre-constructed frame and thus affect reliability of the circuit boards connecting through the rear card cage, e.g., card guides and circuit boards at the rear card cage may not properly fit together and thus pose connection problems.

Additionally, if the manufacturer were to obtain midplanes from multiple vendors and if each vendor provided properly working midplanes with slightly different board thicknesses, the manufacturer would encounter similar tolerance issues when installing the different midplanes in pre-constructed frames. In particular, the midplanes from certain vendors would work less optimally than those from other vendors simply due to variations in board thickness. In some multiple midplane supplier situations, a simple 10% deviation in mean board thickness by each vendor can result in an overall system variation of +/−0.080 inches. Moreover, in order to maintain quality, the system manufacturers would need to impose more stringent tolerance requirements thus potentially lowering supplier yields and increasing the costs of the midplanes. In some instances, a perfectly good midplane could be rejected by a system manufacturer simply because it does not have a board thickness within a specified range, and thus waste an otherwise good midplane.

Furthermore, the above-described conventional approach to bolting midplanes in the middles of large pre-constructed frames does not lend itself well to enabling the midplanes to connect directly with components that are not circuit boards. That is, in order to avoid tolerance stackup problems, manufacturers typically connect components such as fans and power supplies to such midplanes using cables rather than directly connect these components to the midplanes. This use of cables eliminates potential failures due to variations in midplane tolerances. Unfortunately, the installation and maintenance of such cables can be cumbersome, time consuming and costly.

In contrast to the above-described conventional approach to installing midplanes in the middles of pre-constructed frames, embodiments of the invention are directed to techniques for accommodating chassis tolerances utilizing a set of joiners which enables outer side panels for a front card cage to reference a front side of a midplane, and outer side panels for a rear card cage to reference a rear side of the midplane. The set of joiners is capable of coupling the outer side panels together in a rigid but accommodating manner regardless of variations in board thickness from midplane to midplane. As a result, both the front and rear card cages are capable of accurately and consistently referencing from respective midplane sides. Moreover, not only do these techniques solve registration problems which exist in conventional midplane installation approaches, these techniques further enable accurate direct connection of other components such as a power supply subsystem (e.g., to the front side of the midplane) and a fan assembly (e.g., to the rear side of the midplane) thus alleviating the need for burdensome cables.

One embodiment is directed to a support assembly configured to support a first set of circuit boards and a second set of circuit boards. The support assembly includes a midplane defining a first surface configured to connect with the first set of circuit boards and a second surface configured to connect with the second set of circuit boards. The support assembly further includes a first set of outer side panels coupled to the midplane. The first set of outer side panels defines first card cage structures (e.g., fastening holes, locations of card guides, etc.) which are referenced from the first surface defined by the midplane. The first card cage structures are configured to support the first set of circuit boards when the first set of circuit boards connect with the first surface defined by the midplane. The support assembly further includes a second set of outer side panels defining second card cage structures. The second card cage structures are configured to support the second set of circuit boards when the second set of circuit boards connect with the second surface defined by the midplane. The support assembly further includes a set of joiners coupled to both the first set of outer side panels and to the second set of outer side panels. The set of joiners is configured to position the second set of card cage structures in a fixed position relative to the midplane so that the second card cage structures are referenced from the second surface defined by the midplane.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for accommodating chassis tolerances utilizing a set of joiners which enables outer side panels for a front card cage to reference a front side of a midplane, and outer side panels for a rear card cage to reference a rear side of the midplane. The set of joiners is capable of coupling the outer side panels together in a rigid but accommodating manner regardless of variations in board thickness from midplane to midplane. Accordingly, both the front and rear card cages are capable of accurately and consistently referencing from respective midplane sides. Not only do these techniques solve registration problems which exist in conventional midplane installation approaches involving the bolting of midplanes to the middles of pre-constructed frames, these techniques further enable accurate direct connection of other components such as a power supply subsystem (e.g., to the front side of the midplane) and a fan assembly (e.g., to the rear side of the midplane) thus alleviating the need for burdensome cables.

Figure 1:
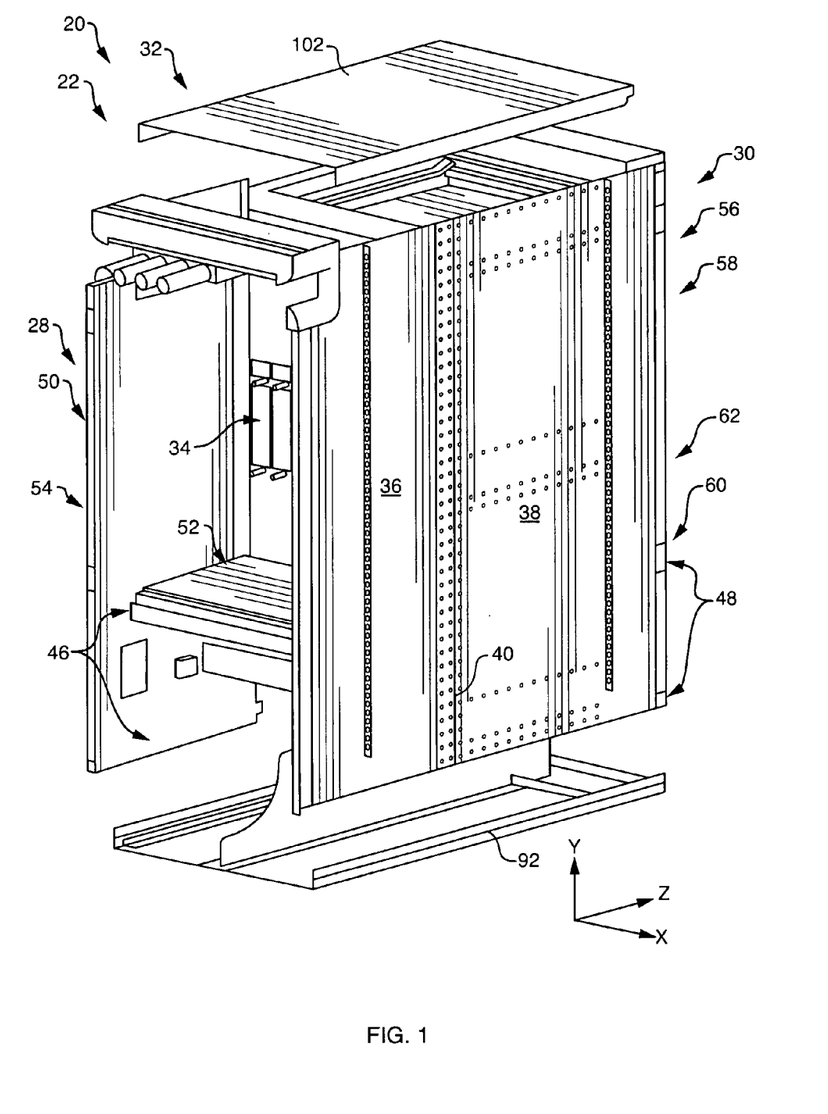
FIG. 1 is a perspective view of an electronic system which utilizes a set of joiners to accommodate chassis tolerances.
Figure 2:
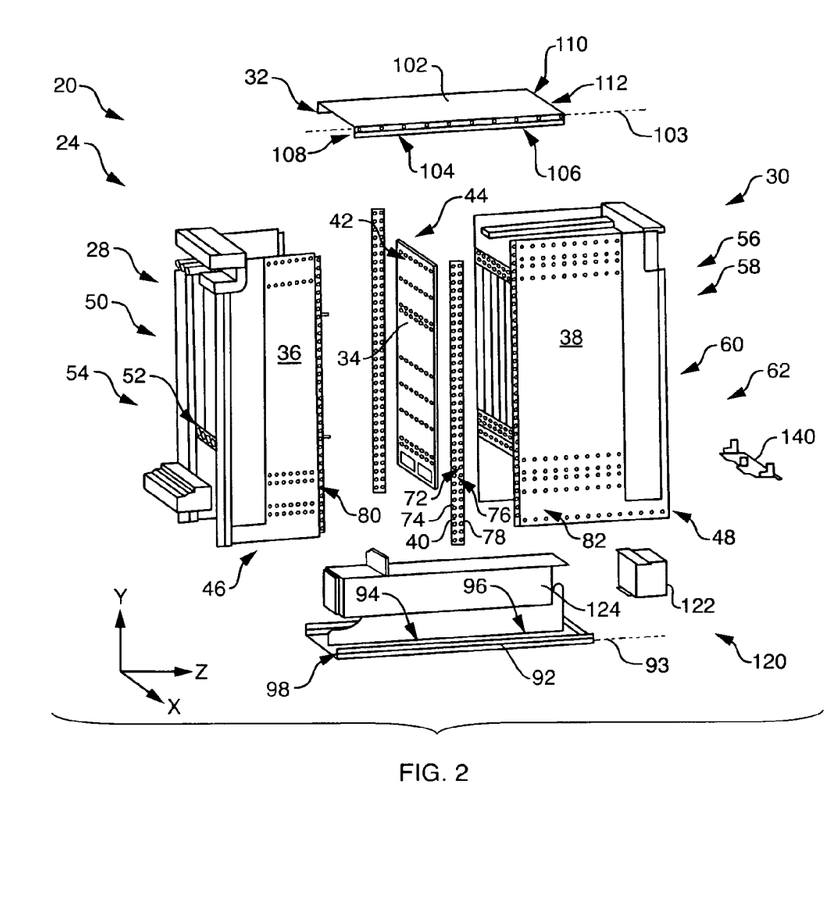
FIG. 2 is an exploded view of the electronic system of FIG. 1.
Figure 3:
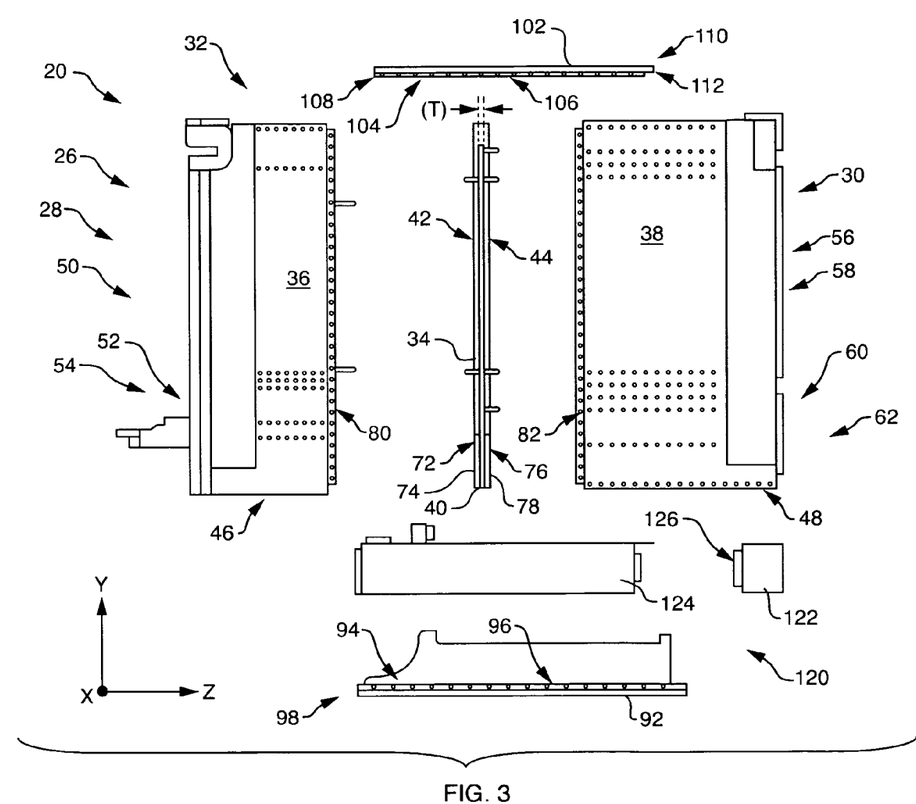
FIG. 3 is a side view of various components of the electronic system of FIG. 1.

FIGS. 1 through 3 show an electronic system 20 which is capable of accommodating a wide variation in midplane board thickness. FIG. 1 shows a perspective view 22 of the electronic system 20. FIG. 2 shows an exploded perspective view 24 of the electronic system 20. FIG. 3 shows a side view 26 of various components of FIG. 2.

As shown in FIGS. 1 through 3, the electronic system 20 includes a first set of circuit boards 28 (shown generally by the arrow 28 in FIGS. 1–3), a second set of circuit boards 30 (shown generally by the arrow 30 in FIGS. 1–3), and a support assembly 32 which is configured to support the first and second sets of circuit boards 28, 30. The support assembly 32 includes a midplane 34, a first set of outer side panels 36 (i.e., a rigid metal panel 36 framing each side of the front of the midplane 34), a second set of outer side panels 38 (i.e., another rigid metal panel 38 on each side of the rear of the midplane 34) and a set of joiners 40 (i.e., a joiner 40 on each lateral side of the midplane 34).

The midplane 34 defines a first surface 42 configured to connect with the first set of circuit boards 28 and a second surface 44 configured to connect with the second set of circuit boards 30 (see FIGS. 2 and 3). In particular, the surfaces 42, 44 extend in X-Y plane, and the circuit boards 28, 30 connect and disconnect with the midplane 34 by moving along the Z-axis which is orthogonal to the X-Y plane. The first set of outer side panels 36 couples to the midplane 34 (e.g., by bolting the midplane directly to the outer side panels 36). The first set of outer side panels 36 defines first card cage structures 46 which are referenced from the first surface 42. In particular, the first card cage structures 46 (e.g., mounting locations for mounting card guides, screw holes, etc.) are configured to support the first set of circuit boards 28 when the first set of circuit boards 28 connect with the first surface 42 defined by the midplane 34 (i.e., the circuit boards 28 connect when moved in the positive Z-direction). Similarly, the second set of outer side panels 38 define second card cage structures 48 which are configured to support the second set of circuit boards 30 when the second set of circuit boards 30 connect with the second surface 44 defined by the midplane 34 (i.e., the circuit boards 30 connect when moved in the negative Z-direction).

The set of joiners 40 couples to both the first set of outer side panels 36 and to the second set of outer side panels 38. As will be explained shortly in further detail, the set of joiners 40 is configured to position the second set of card cage structures 48 in a fixed position relative to the midplane 34 so that the second card cage structures 48 are referenced from the second surface 44 defined by the midplane 34 regardless of variation in board thickness (T) (FIG. 3).

It should be further understood that due to the above-described geometries, the outer side panels 36, 38 skirt the midplane 34 and thus enable the midplane connecting surfaces 42, 44 to provide maximum connecting area. That is, this design allows for the widest midplane 34 possible.

In some arrangements, the electronic system 20 is a networking device which is configured to perform a variety of data communications operations. For example, in certain arrangements, the first set of circuit boards 28 includes multiple programmable line card interface modules (PLIMs) 50 (generally shown by the arrow 50 in FIG. 1) configured to exchange optical signals with an external network, and the first set of outer side panels 36 are configured to form, in combination with a first set of card guides 52, a first card cage subassembly 54 to support the multiple PLIMs 50 relative to the midplane 34. Furthermore, the second set of circuit boards 30 includes multiple line cards 56 and multiple fabric cards 58 (generally shown by the arrows 56, 58 in FIG. 1) configured to exchange optical signals with an internal network, and the second set of outer side panels 38 are configured to form, in combination with a second set of card guides 60, a second card cage subassembly 62 to support the multiple line cards 56 and the multiple fabric cards 58 relative to the midplane 34. In particular arrangements, the card cage subassemblies 54, 62 are pre-built but nevertheless individually enjoy referencing from the datum plane for the side 42, 44 the are located. Further details will now be provided with reference to FIG. 4.

Figure 4:
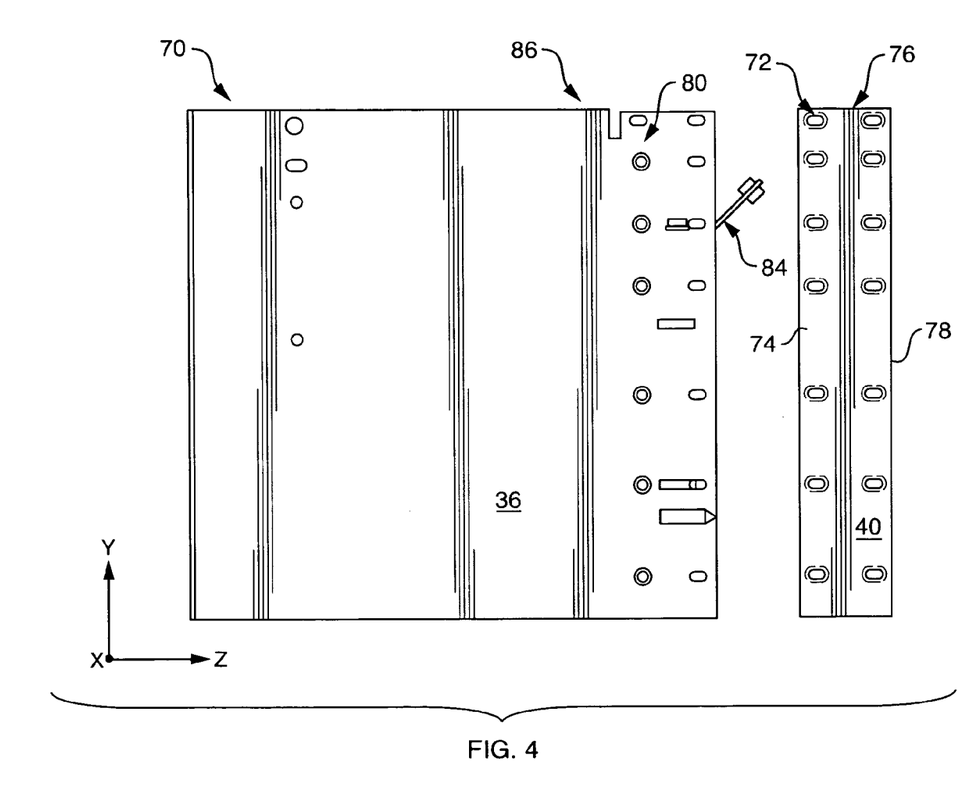
FIG. 4 is a detailed view of a joining portion of the electronic system of FIG. 1.

FIG. 4 is a detailed view 70 of a joiner 40 and an outer side panel 38. It should be understood that the joiner 40 and the outer side panel 38 on the right hand side of the system 20 (e.g., as shown in FIG. 2) are shown but that a similar mirror image arrangement exists for another joiner 40 and another outer side panel 38 on the left hand side. As shown, the joiner 40 is configured as a rigid metal bracket which is elongated in shape and extends along the Y-axis.

The joiner 40 defines a series of oblong holes 72 along a first edge 74 and a series of oblong holes 76 along a second edge 78 which is opposite the first edge 74. The oblong holes 76, which are also called slots or obrounds, are elongated in along the Z-axis. The oblong holes 72 and the oblong holes 76 run as parallel columns of holes down the length of the joiner 40 along the Y-axis. The series of oblong holes 72 is configured align with holes 80 defined along the first set of outer side panels 36. Similarly, the series of oblong holes 76 along the second edge 78 are configured to align with holes 82 defined along the second set of outer side panels 38 (also see FIG. 3).

As described above, the joiners 40 enable the electronic system 20 to operate as a compliant system of floating and preloaded subsystems. In some arrangements each oblong hole 72 allows for a 0.090 inch variation along the Z-axis. Accordingly, in total, each joiner 40 allows for a 0.180 inch variation in along the Z-axis, i.e., a 0.090 inch variation at the mating of the first column of oblong holes 72 and another 0.090 inch variation at the mating of the second column of oblong holes 76. As a result, the design of the support assembly 32 accommodates up to a 0.180 inch variation in board thickness (T) of the midplane 34.

Construction of the support assembly 32 preferably involves fastening the midplane 34 and the joiners 40 to the first set of outer side panels 36. At this point, the outer side panels 36 and thus the first card cage subassembly 54 reference from the first surface 42 defined by the midplane 34. Next, the second set of outer side panels 38 attaches to the joiners 40. In particular, hardware (e.g., nuts and bolts, etc.) engage the circular holes of the outer side panels 38 and the oblong holes 76 along the joiners 40. Tolerance issues due to deviation in board thickness T (FIG. 3) are accommodated by adjustments in the outer side panels 38 relative to the joiners 40 along the Z-axis. Accordingly, the outer side panels 38 and therefore the second card cage subassembly 56 reference from the second surface 44 defined by the midplane 34 regardless of such board thickness (T) deviation (e.g., up to a 0.180 inch variation).

It should be understood that the various components of the support assembly 32 (FIGS. 1–3) are capable of being configured with other features to improve overall strength and electrical connectivity. For example, as further shown in FIG. 4, the outer side panel 36 is configured with an electrical harness 84 which is configured to attach to the corresponding outer side panel 38 to improve electrical connectivity therebetween. Additionally, the outer side panel 36 is configured with a joggle 86 or slot to inhibit shifting, allow for a flush outer surface, and provide added support between the outer side panel 36 and the joiner 40. Further details will now be provided with reference to FIG. 5.

Figure 5:
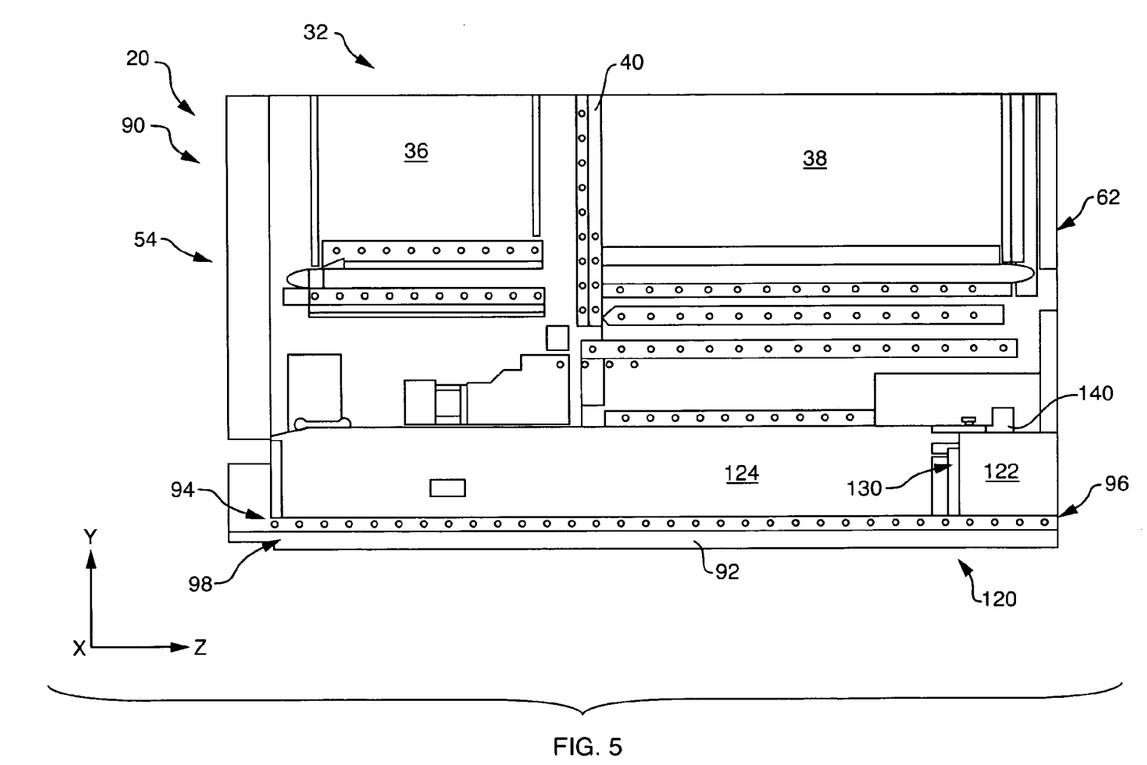
FIG. 5 is a detailed view of a bottom portion of the electronic system of FIG. 1.

FIG. 5 is a detailed side view 90 of a bottom portion of the support assembly 32. As shown, the support assembly 32 further includes a bottom section 92 which defines, along a single common axis 93 in the Z-direction, a series of circular holes 94 followed by a series of oblong holes 96. Although a single edge 98 of the bottom section 92 as shown in FIG. 5 (also see the right hand side of the bottom section 92 in FIGS. 1–2), it should be understood that the bottom section 92 defines multiple edges 98 (i.e., there is another edge 98 on the left hand side of the bottom section 92, see FIGS. 1–2) having a series of circular holes 94 followed by a series of oblong holes 96.

The series of circular holes 94 followed by the series of oblong holes 96 along the edges 98 defined by the bottom section 92 align with circular holes along the bottom edges of the outer side panels 36, 38. The oblong holes 96 are elongated in the Z-direction in a manner similar to the oblong holes 76 defined by the joiners 40. Accordingly, the bottom section 92 and the outer side panels 36, 38 can be easily and rigidly bolted together. In particular, the bottom section 92 registers precisely with the outer side panels 36 because the circular holes of the outer side panels 36 accurately match up with the series of circular holes 94.

Additionally, the bottom section 92 accommodates the outer side panels 38 because the circular holes of the outer side panels 38 match up with the series of oblong holes 94. Even though the outer side panels 38 reference from the back surface 44 of the midplane 34 due to circular holes along the side edge of the outer side panels 38 matching with the oblong holes 76 defined by the joiners 40, it should be understood that the circular holes along the bottom edge of the outer side panels 38 match with the oblong holes 96. Thus, the bottom section 92 is capable of accommodating tolerance deviations between the relative positions of the outer side panels 36, 38 and nevertheless bolting properly and contemporaneously fastening to the outer side panels 36, 38.

The joints formed between the bottom section 92 and the outer side panels 36, 38 (e.g., using bolts or similar hardware) can be reinforced (e.g., using a locking plate). The cohesion between these three structural components of the support assembly 32 enable the support assembly 32 to enjoy an extremely high degree of structural strength in all directions. Further details will now be provided with reference to FIG. 6.

Figure 6:
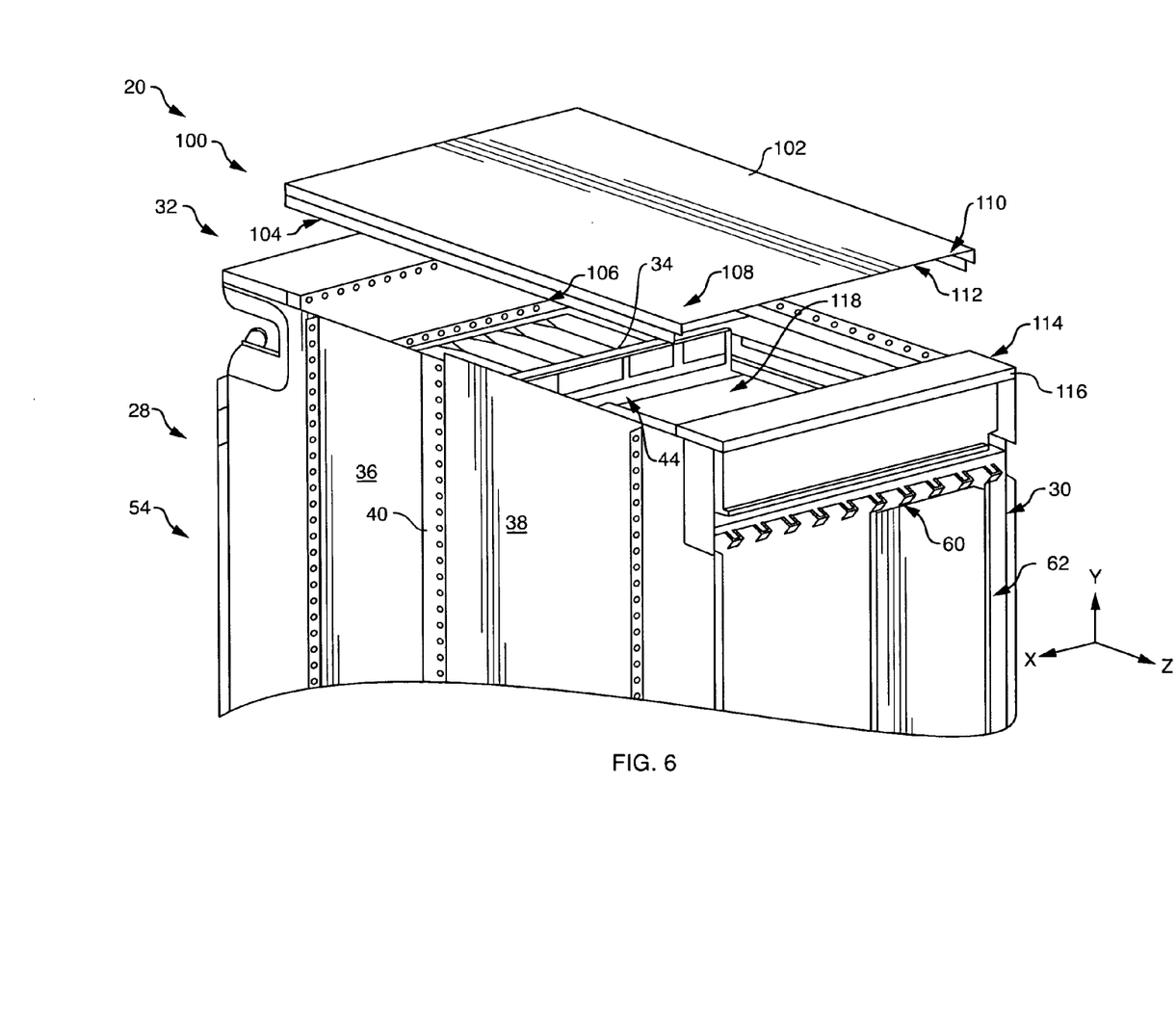
FIG. 6 is a detailed view of a top portion of the electronic system of FIG. 1.

FIG. 6 is a detailed perspective view 100 of a top portion of the support assembly 32. The view 100 is from a reverse angle to that of FIGS. 1 and 2. Accordingly, portions of the back side of the system 20 are more visible. As shown in FIG. 6, the support assembly 32 further includes a top section 102 which defines, along a single common axis 103 in the Z-direction, a series of circular holes 104 followed by a series of oblong holes 106. In a manner similar to that of the bottom section 92, the top section 102 defines the series of circular holes 104 and the series of oblong holes 106 along multiple edges 108.

The series of circular holes 104 followed by the series of oblong holes 106 along the edges 108 defined by the top section 102 align with circular holes along the top edges of the outer side panels 36, 38. The oblong holes 106 are elongated in the Z-direction in a manner similar to the oblong holes 76 defined by the joiners 40. As a result, the top section 102 and the outer side panels 36, 38 can be easily and rigidly bolted together. That is, the top section 102 precisely registers with the outer side panels 36 because the circular holes of the outer side panels 36 accurately match up with the series of circular holes 104.

Furthermore, the top section 102 accommodates the outer side panels 38 because the circular holes of the outer side panels 38 match up with the series of oblong holes 104. Even though the outer side panels 38 register from the back surface 44 of the midplane 34 due to circular holes along the side edge of the outer side panels 38 matching with the oblong holes 76 defined by the joiners 40, it should be understood that the circular holes along the top edge of the outer side panels 38 match with the oblong holes 106. Accordingly, in the same manner as the bottom section 92, the top section 102 is capable of accommodating tolerance deviations between the relative positions of the outer side panels 36, 38 and nevertheless bolting properly and contemporaneously fastening to the outer side panels 36, 38.

It should be understood that the top section 102 is further equipped with a row of circular holes 110 and locking plate 112. The row of circular holes 110 align with a corresponding row of oblong holes 114 defined by a brace 116 (i.e., a bracket or a handle) that extends between the outer side panels 38, the locking plate 112 engages with the brace 116 (e.g., in an interleaved manner) to enable the top section 102 and the brace 116 to be screwed together for secure and rigid attachment. The brace 116 provides structure strength to the support assembly 32 and enables other components such as a tray of fans 118 (shown generally by the arrow 118 in FIG. 6) to reference from the rear side of the support assembly 32. That is, this fan subassembly 118 registers from the back surface 44 of the midplane 34 and directly connects to the back surface 44 of the midplane 34 (e.g., without cables extending from the midplane 34 to the fan subassembly 118). There are no tolerance stackup issues caused by board thickness (T) (FIG. 3) variations in the midplane 34 since the fans subassembly references from the surface 44 that it connects to. Further details will now be provided with reference to FIGS. 5 and 7–9.

Figure 7:
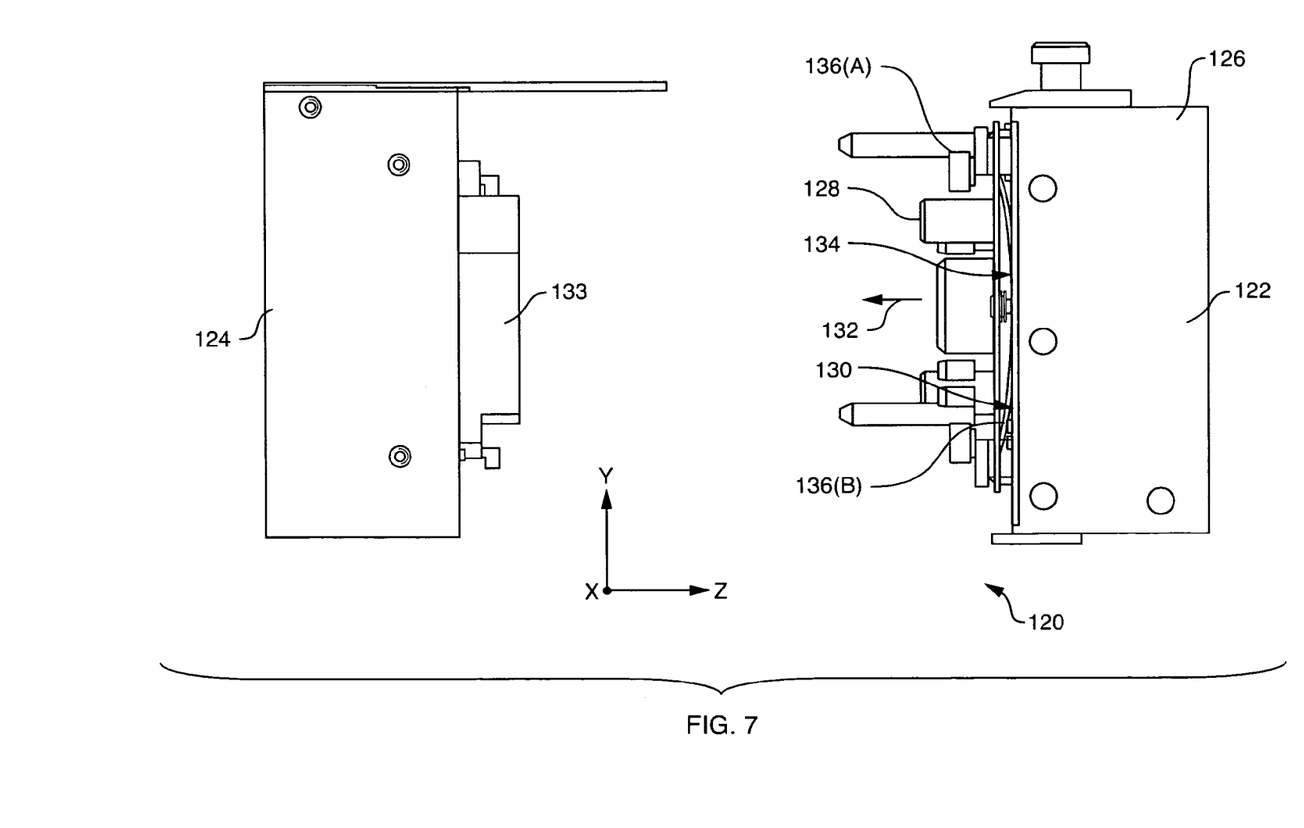
FIG. 7 is a detailed view of a power supply subsystem of the electronic system of FIG. 1.
Figure 8:
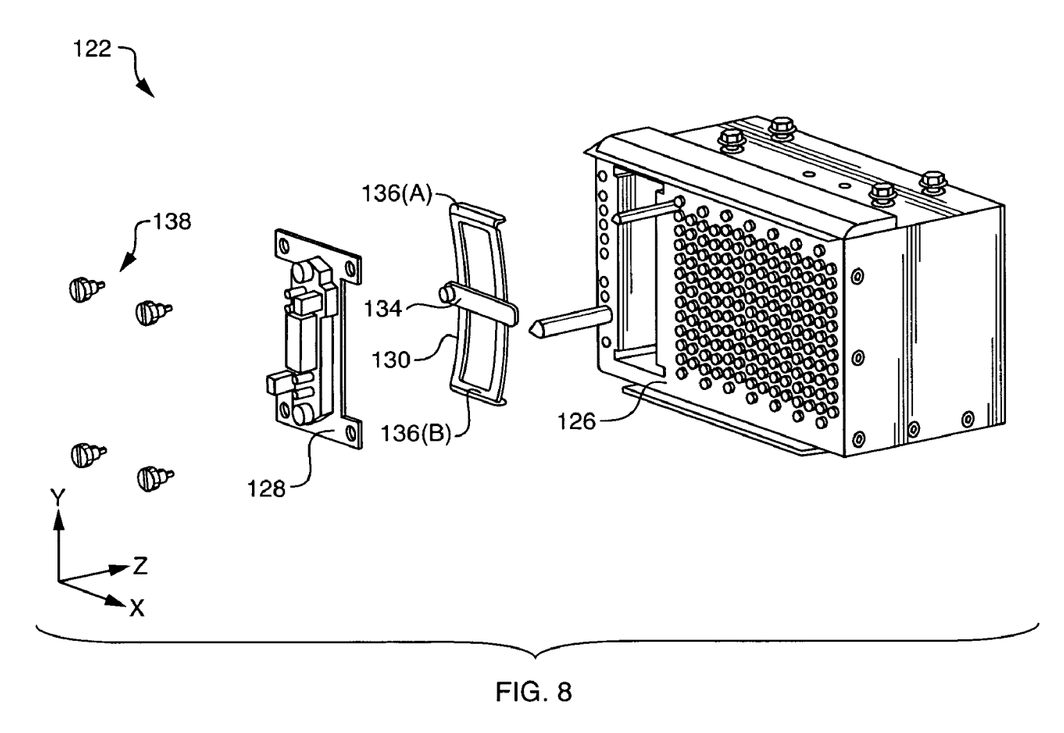
FIG. 8 is an exploded view of a power distribution unit of the power supply subsystem of FIG. 7.
Figure 9:
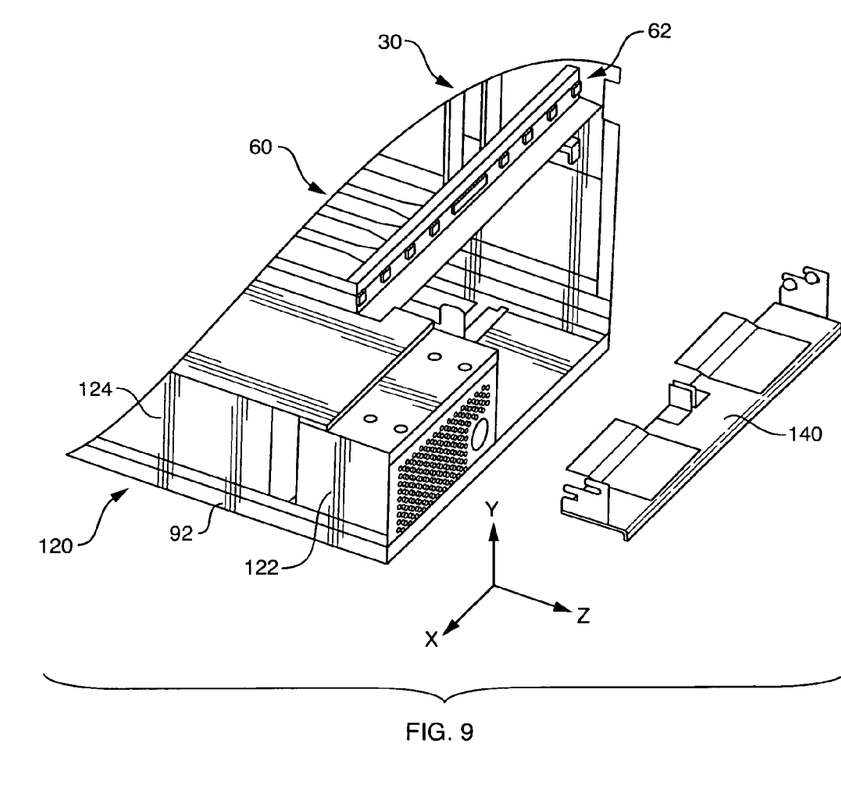
FIG. 9 is a perspective view of the electronic system from an angle which is different than that of FIG. 1.

FIGS. 5 and 7–9 show particular details of a power supply subsystem 120 of the electronic system 20. FIG. 5 shows a side view of the power supply subsystem 120. FIG. 7 shows a detailed view of particular connecting portions of the power supply subsystem 120. FIG. 8 is an exploded view of a portion of the power supply subsystem 120 of FIG. 7. FIG. 9 is a perspective view of the electronic system 20 from an angle which is different than that of FIG. 1.

As shown in FIGS. 5 and 7–9, the power supply subsystem 120 includes a power distribution unit 122 and a power module 124. The power distribution unit 122 is configured to connect to an external power feed, e.g., an AC Wye power feed, an AC Delta power feed, a DC power feed, etc. The power module 124 is interconnected between the power distribution unit 122 and the midplane 34, and converts that power feed into a set of power supply signals (e.g., 48 VDC to the midplane 34) for use by circuitry of the electronic system 20 (e.g., the circuit boards 28, 30, the fan assembly 118, etc.).

The power module 124 is configured to connect directly to the front surface 42 of the midplane 34 (FIG. 5). Along these lines, the power module 124 references from the front surface 42 of the midplane 34 so that there are no tolerance stackup issues between the power module 124 and the midplane 34 which could otherwise be caused by variations in the board thickness T (FIG. 3) of the midplane 34.

As shown in FIG. 7, the power distribution unit 122 includes a body 126 configured to connect with the external power feed, a connector 128 configured to connect with the power module 124, and a leaf spring 130 which is configured to exert a force 132 in the negative Z-direction between the body 126 and the connector 128. The connector 128 is configured to robustly connect with a corresponding connector 129 of the power module 124 which is fixed in the Z-direction but is capable of floating in the X-Y plane for proper registration with the connector 128. As shown in FIG. 8, a central portion 134 of the leaf spring 130 is configured to contact the body 126, and end portions 136(A), 136(B) are configured to contact the connector 128. Fasteners 138 hold the connector 128 and the leaf spring 130 in place relative to the body 126.

As shown in FIG. 9, the support assembly 32 further includes a power supply bracket 140 which attaches to the second set of outer side panels 38 and thus references the second surface 44 of the midplane 34. The power supply bracket 140 maintains the power distribution unit 122 in a fixed position within the support assembly 32. This subframe design forces the power distribution unit 122 forward +0.080 inches proud with a preload force greater than the worst case connector insertion loads. Accordingly, the leaf spring 130 is able to apply the force 132 in a relatively constant and evenly distributed manner to the connector 128 to provide reliable engagement of the connector 128 with the power module 124. As a result, this creates a controllable preload and load range on the connector over the tolerance ranges which are expected. Such a spring design is superior to multiple coil springs which risk application of forces unevenly and further have the potential to bind up and fail.

It should be noted that in arrangements that provide significant tolerance variation, the connectors of the power supply subsystem 120 (e.g., see the connector 128 in FIG. 8) enjoys tolerance variation in pin wipe. For example, where the joiners 40 provide 0.180 inches of variation along the Z-axis, the connectors enjoy +/−0.080 inch variation of connector location while working with connector pin and socket wipe lengths which are only +/−0.040 inches.

As described above, embodiments of the invention are directed to techniques for accommodating chassis tolerances utilizing a set of joiners 40 which enables outer side panels 36 for a front card cage 54 to reference a front side 42 of a midplane 34, and outer side panels 38 for a rear card cage 56 to reference a rear side 44 of the midplane 34. The joiners 40 are capable of coupling the outer side panels 36, 38 together in a rigid but accommodating manner regardless of variations in board thickness (T) from midplane to midplane. As a result, both the front and rear card cages 54, 56 are capable of accurately and consistently referencing from the midplane sides. Not only do these techniques solve registration problems which exist in conventional midplane installation approaches involving the bolting of midplanes to the middles of pre-constructed frames, these techniques further enable accurate direct connection of other components such as a power supply subsystem 120 (e.g., to the front side 42 of the midplane 34) and a fan subassembly 118 (e.g., to the rear side 44 of the midplane 34) thus alleviating the need for burdensome cables.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic system, comprising:
   a first set of circuit boards;
   a second set of circuit boards; and
   a support assembly configured to support the first set of circuit boards and the second set of circuit boards, the support assembly including:
   a midplane defining a first surface configured to connect with the first set of circuit boards and a second surface configured to connect with the second set of circuit boards;
   a first set of outer side panels coupled to the midplane, the first set of outer side panels defining first card cage structures which are referenced from the first surface defined by the midplane, the first card cage structures being configured to support the first set of circuit boards when the first set of circuit boards connect with the first surface defined by the midplane;
   a second set of outer side panels defining second card cage structures, the second card cage structures being configured to support the second set of circuit boards when the second set of circuit boards connect with the second surface defined by the midplane; and
   a set of joiners coupled to both the first set of outer side panels and to the second set of outer side panels, the set of joiners being configured to position the second set of card cage structures in a fixed position relative to the midplane so that the second card cage structures are referenced from the second surface defined by the midplane.

2. An electronic system as in claim 1 wherein the set of joiners includes:
a first joiner and a second joiner, each of the first joiner and the second joiner defining a first series of oblong holes along a first edge configured to align with holes defined along the first set of outer side panels, and a second series of oblong holes along a second edge configured to align with holes defined along the second set of outer side panels.

3. An electronic system as in claim 2 wherein the first set of circuit board is configured to connect with the first surface defined by the midplane when moved toward the first surface in a first direction;
wherein the second set of circuit board is configured to connect with the second surface defined by the midplane when moved toward the second surface in a second direction which is substantially opposite the first direction; and
wherein each of the first series of circular holes and the second series of circular holes defined by the first joiner and the second joiner extends along an axis which is substantially perpendicular to the first and second directions.

4. An electronic system as in claim 3 wherein the first set of circuit boards includes multiple programmable line card interface modules configured to exchange optical signals with an external network;
wherein the first set of outer side panels are configured to form, in combination with a first set of card guides, a first card cage subassembly to support the multiple programmable line card interface modules relative to the midplane;
wherein the second set of circuit boards includes multiple line cards and multiple fabric cards configured to exchange optical signals with an internal network; and
wherein the second set of outer side panels are configured to form, in combination with a second set of card guides, a second card cage subassembly to support the multiple line cards and the multiple fabric cards relative to the midplane.

5. An electronic system as in claim 3 wherein the support assembly further includes:
a bottom section having a left edge portion and a right edge portion, each of the left edge portion and the right edge portion defining (i) a series of circular holes configured to align with a corresponding series of circular holes defined by the first set of outer side panels and (i) a series of oblong holes configured to align with a corresponding series of circular holes defined by the second set of outer side panels, the series of circular holes and the series of oblong holes sharing a common axis.

6. An electronic system as in claim 3 wherein the support assembly further includes:
a top cover having a left edge portion, a right edge portion and a third edge portion;
wherein each of the left edge portion and the right edge portion defining (i) a series of circular holes configured to align with a corresponding series of circular holes defined by the first set of outer side panels and (i) a series of oblong holes configured to align with a corresponding series of circular holes defined by the second set of outer side panels, the series of circular holes and the series of oblong holes sharing a common axis; and
wherein the third edge portion defines a series of oblongs corresponding to a set of circular holes defined by a brace which extends between outer side panels of the second set of outer side panels.

7. An electronic system as in claim 3 wherein the support assembly further includes:
a power supply subsystem which directly connects with the first surface of the midplane, the power supply subsystem including (i) a power distribution unit which is configured to connect to an external power feed, and (ii) a power module which is configured to interconnect between the power distribution unit and the midplane, the power module being configured to convert power for use by the first and second sets of circuit boards regardless of whether the external power feed is an AC wye power feed, an AC Delta power feed or a DC power feed.

8. An electronic system as in claim 7 wherein the power distribution unit includes:
a body configured to connect with the external power feed;
a connector configured to connect with the power module; and
a leaf spring which is configured to exert a constant force between the body and the connector to provide reliable engagement of the connector with the power module.

9. An electronic system, comprising:
a first set of circuit boards;
a second set of circuit boards; and
a support assembly configured to support the first set of circuit boards and the second set of circuit boards, the support assembly including:
a midplane defining a first surface configured to connect with the first set of circuit boards and a second surface configured to connect with the second set of circuit boards,
a first set of outer side panels coupled to the midplane, the first set of outer side panels defining first card cage structures which are referenced from the first surface defined by the midplane, the first card cage structures being configured to support the first set of circuit boards when the first set of circuit boards connect with the first surface defined by the midplane;
a second set of outer side panels defining second card cage structures, the second card cage structures being configured to support the second set of circuit boards when the second set of circuit boards connect with the second surface defined by the midplane,
a set of joiners coupled to both the first set of outer side panels and to the second set of outer side panels, the set of joiners being configured to position the second set of card cage structures in a fixed position relative to the midplane to reference the second card cage structures from the second surface defined by the midplane, and
a power supply subsystem which directly connects with the first surface of the midplane, the power supply subsystem including (i) a power distribution unit which is configured to connect to an external power feed, and (ii) a power module which is configured to interconnect between the power distribution unit and the midplane, the power module being configured to convert power for use by the first and second sets of circuit boards regardless of whether the external power feed is an AC wye power feed, an AC Delta power feed or a DC power feed.

10. An electronic system as in claim 9 wherein the power distribution unit includes:
- a body configured to connect with the external power feed;
- a connector configured to connect with the power module; and
- a leaf spring which is configured to exert a constant force between the body and the connector to provide reliable engagement of the connector with the power module.

11. A support assembly configured to support a first set of circuit boards and a second set of circuit boards, the support assembly comprising:
- a midplane defining a first surface configured to connect with the first set of circuit boards and a second surface configured to connect with the second set of circuit boards;
- a first set of outer side panels coupled to the midplane, the first set of outer side panels defining first card cage structures which are referenced from the first surface defined by the midplane, the first card cage structures being configured to support the first set of circuit boards when the first set of circuit boards connect with the first surface defined by the midplane;
- a second set of outer side panels defining second card cage structures, the second card cage structures being configured to support the second set of circuit boards when the second set of circuit boards connect with the second surface defined by the midplane; and
- a set of joiners coupled to both the first set of outer side panels and to the second set of outer side panels, the set of joiners being configured to position the second set of card cage structures in a fixed position relative to the midplane so that the second card cage structures are referenced from the second surface defined by the midplane.

12. A support assembly as in claim 11 wherein the set of joiners includes:
- a first joiner and a second joiner, each of the first joiner and the second joiner defining a first series of oblong holes along a first edge configured to align with holes defined along the first set of outer side panels, and a second series of oblong holes along a second edge configured to align with holes defined along the second set of outer side panels.

13. A support assembly as in claim 12 wherein the first set of circuit board is configured to connect with the first surface defined by the midplane when moved toward the first surface in a first direction;
wherein the second set of circuit board is configured to connect with the second surface defined by the midplane when moved toward the second surface in a second direction which is substantially opposite the first direction; and
wherein each of the first series of circular holes and the second series of circular holes defined by the first joiner and the second joiner extends along an axis which is substantially perpendicular to the first and second directions.

14. A support assembly as in claim 13 wherein the first set of circuit boards includes multiple programmable line card interface modules configured to exchange optical signals with an external network;
wherein the first set of outer side panels are configured to form, in combination with a first set of card guides, a first card cage subassembly to support the multiple programmable line card interface modules relative to the midplane;
wherein the second set of circuit boards includes multiple line cards and multiple fabric cards configured to exchange optical signals with an internal network; and
wherein the second set of outer side panels are configured to form, in combination with a second set of card guides, a second card cage subassembly to support the multiple line cards and the multiple fabric cards relative to the midplane.

15. A support assembly as in claim 13, further comprising:
- a bottom section having a left edge portion and a right edge portion, each of the left edge portion and the right edge portion defining (i) a series of circular holes configured to align with a corresponding series of circular holes defined by the first set of outer side panels and (i) a series of oblong holes configured to align with a corresponding series of circular holes defined by the second set of outer side panels, the series of circular holes and the series of oblong holes sharing a common axis.

16. A support assembly as in claim 13, further comprising:
- a fan subassembly which couples to the second set of outer side panels and which receives support from the second set of outer side panels.

17. A support assembly as in claim 13, further comprising:
- a top cover having a left edge portion, a right edge portion and a third edge portion;
wherein each of the left edge portion and the right edge portion defining (i) a series of circular holes configured to align with a corresponding series of circular holes defined by the first set of outer side panels and (i) a series of oblong holes configured to align with a corresponding series of circular holes defined by the second set of outer side panels, the series of circular holes and the series of oblong holes sharing a common axis; and
wherein the third edge portion defines a series of circular holes corresponding to a set of oblong holes defined by a brace which extends between outer side panels of the second set of outer side panels.

18. A support assembly as in claim 13, further comprising:
- a power supply subsystem which directly connects with the first surface of the midplane.

19. A support assembly as in claim 18 wherein the power supply subsystem includes:
- a power distribution unit which is configured to connect to an external power feed; and
- a power module which is configured to interconnect between the power distribution unit and the midplane, the power module being configured to convert power for use by the first and second sets of circuit boards regardless of whether the external power feed is an AC wye power feed, an AC Delta power feed or a DC power feed.

20. A support assembly as in claim 19 wherein the power distribution unit includes:
- a body configured to connect with the external power feed;
- a connector configured to connect with the power module; and
- a leaf spring which is configured to exert a constant force between the body and the connector to provide reliable engagement of the connector with the power module.

21. A support assembly configured to support a first set of circuit boards and a second set of circuit boards, the support assembly comprising:
- a midplane defining a first surface configured to connect with the first set of circuit boards and a second surface configured to connect with the second set of circuit boards;
- a first set of outer side panels coupled to the midplane, the first set of outer side panels defining first card cage structures which are referenced from the first surface defined by the midplane, the first card cage structures being configured to support the first set of circuit boards when the first set of circuit boards connect with the first surface defined by the midplane;
- a second set of outer side panels defining second card cage structures, the second card cage structures being configured to support the second set of circuit boards when the second set of circuit boards connect with the second surface defined by the midplane; and
- means for joining the first set of outer side panels to the second set of outer side panels, the means for joining being configured to position the second set of card cage structures in a fixed position relative to the midplane so that the second card cage structures are referenced from the second surface defined by the midplane.

22. An electronic system as in claim 9 wherein the power distribution unit is disposed adjacent the first card cage structures defined by the first set of outer side panels; and wherein the power distribution unit and the first card cage structures defined by the first set of outer side panels extend from the first surface defined by the midplane in a substantially perpendicular manner from the midplane.

* * * * *